US006990129B2

(12) United States Patent
Buimovich et al.

(10) Patent No.: US 6,990,129 B2
(45) Date of Patent: Jan. 24, 2006

(54) CHARACTERIZATION OF MULTIPLE SECTION SEMICONDUCTOR LASERS

(75) Inventors: Efraim Buimovich, Tel Aviv (IL); Shmuel Rubin, Netanya (IL); Dan Sadot, Kfar Bilu (IL)

(73) Assignee: Xlight Photonics Inc., Wilmington, DE (US)

( * ) Notice: Subject to any disclaimer, the term of this patent is extended or adjusted under 35 U.S.C. 154(b) by 371 days.

(21) Appl. No.: 10/333,674

(22) PCT Filed: Aug. 7, 2001

(86) PCT No.: PCT/IL01/00727

§ 371 (c)(1),
(2), (4) Date: Apr. 18, 2003

(87) PCT Pub. No.: WO02/13341

PCT Pub. Date: Feb. 14, 2002

(65) Prior Publication Data

US 2003/0161370 A1    Aug. 28, 2003

(30) Foreign Application Priority Data

Aug. 7, 2000    (IL)    .................................... 137732

(51) Int. Cl.
*H01S 3/10* (2006.01)
*H01S 3/00* (2006.01)

(52) U.S. Cl. ........................ 372/26; 372/20; 372/38.07

(58) Field of Classification Search .................. 372/26, 372/20, 38.07, 44
See application file for complete search history.

(56) References Cited

U.S. PATENT DOCUMENTS

| 5,438,444 | A | 8/1995 | Tayonaka et al. |
| 5,475,679 | A | 12/1995 | Munter |
| 5,621,893 | A | 4/1997 | Joh |
| 6,069,893 | A | 5/2000 | Parruck et al. |
| 6,574,259 | B1 * | 6/2003 | Fish et al. ..................... 372/50 |
| 2002/0051472 | A1 * | 5/2002 | Morthier .................. 372/29.01 |

OTHER PUBLICATIONS

Fumiyoshi et al, High-speed Intensity Modualtio of 1.5 um DBR lasers with wavelength tuning, Aug. 1990, IEEE Journal of Quantum Electronics, vol. 26, No. 8, pp. 1340-1345.*
International Preliminary Examination Report of International Patent Application No. PCT/IL01/00727, filed Aug. 7, 2001.

* cited by examiner

*Primary Examiner*—Minsun Oh Harvey
*Assistant Examiner*—Armando Rodriguez
(74) *Attorney, Agent, or Firm*—Darby & Darby

(57) ABSTRACT

A method for characterizing tunable semiconductor laser diodes in which the laser is stimulated in a way that discloses the optical properties and tuning current dependency of the individual sections of the laser, separately for each section, and independently of the other sections. A section of the laser is current modulated in order to excite a continuum of modes related to the spectral response of other sections. This process is observed by viewing the overall spectral response at an integration time significantly longer than the modulation time. The spectral positions of the modes and their dependence on the tuning current, are used to determine the tuning characteristic of that particular section. This method substantially reduces the time required for characterization of such lasers in comparison with prior art methods.

8 Claims, 8 Drawing Sheets

CHARACTERIZATION OF MULTIPLE SECTION SEMICONDUCTOR LASERS

FIELD OF THE INVENTION

The present invention relates to the field of tunable semiconductor laser diodes, especially methods of characterizing the currents required to tune the laser to a desired wavelength.

BACKGROUND OF THE INVENTION

Tunable semiconductor laser diodes (TSLD's) are key components in the implementation of present and future optical communication systems. The first TSLD's used temperature control tuning, i.e. a temperature change generated in the TSLD caused a change in its physical dimensions, thus changing its wavelength. This method of tuning the laser is relatively slow. The tuning time is in the order of milliseconds or more, making it too slow for applications where fast wavelength switching is required. Furthermore, the repeatability, accuracy and tuning range are limited and unsuitable for advanced applications such as dense dynamic WDM systems, and optical switches and routers.

A laser can radiate at wavelengths that have a round trip phase change through the cavity from end to end of $2k\pi$ (k in an integer). These wavelengths define the Fabry Perot modes of the cavity. In order to ensure single longitudinal mode operation of the laser, the net gain of the preferred lasing mode must be higher then that of the other Fabry Perot modes. In a TSLD, cavity mode discrimination is achieved using wavelength selective structures such as reflectors, sampled reflectors (SG), super structure reflectors (SSG) and couplers.

A new family of TSLD's have recently been developed, which use the free plasma effect in these structures as the tuning mechanism. By injecting current into these structures a change in the optical refraction index is invoked, thus changing their optical properties and ultimately changing the wavelength of the laser.

When the laser is correctly tuned, all of these sections provide the maximal transmission at the desired wavelength and attenuate other modes, thus ensuring single mode operation. If the laser is not correctly tuned, i.e. the wavelength selective sections are not all aligned to a common wavelength, or the phase current is not adjusted to meet the phase condition at the desired wavelength, the laser may operate in an unstable mode, or may not operate at all. An arbitrary set of tuning currents usually results in no lasing power. This is why a multi-dimensional scan of the tuning currents generally yields comparatively poor tuning results.

These TSLD's provide fast tuning capabilities together with accuracy, stability and repeatability. The number of structures or sections in such a laser determine the number of input currents that have to be provided in order to tune the laser.

Characterization of a tunable, multiple section semiconductor laser is a process in which the tuning currents (or voltages) necessary to tune the laser to a given wavelength are determined. The term characterization is thuswise used and claimed in this application. The characterization procedure presents a serious problem in laser manufacture. This information can not be determined during production, and is different for each individual laser due to microscopic differences between the lasers, even though manufactured to be nominally identical.

The difficulty in measuring the spectral response and tuning characteristic of a particular tuning section of a laser is that the overall response of the laser depends at the same time on all the other sections. When changing the tuning current in a certain section in order to measure the shift in the response of that section, the laser power usually drops unless adjustment is also made to the other currents.

Current techniques for the characterization of multiple section lasers, such as DBR, SG-DBR, and GCSR lasers, use methods largely based on trial and error. A set of currents is introduced to the laser, and the wavelength and optical power are measured. The set is slightly changed and the process is repeated. As there are generally three or four different tuning currents, depending on the number of sections, this process involves a three or four-dimensional scan of the input currents to the laser. In this way the tuning currents for different wavelengths can be obtained. This method is very time and labor consuming, currently taking several hours per laser, and adds significant additional costs to the laser beyond the direct manufacturing costs. More recent developments of this basic method use what could be termed as intelligently directed trial and error methods, but the characterization procedure is still a time consuming process. A recent method is described in the PCT Patent Application by B. Broberg et al, for "Method of optimizing the operation points of lasers and means for carrying out the method", published as No. WO 99/40654 and hereby incorporated by reference in its entirety. Another recent method of laser characterization is given in the article entitled "Novel mode stabilization scheme for widely tunable lasers" by G. Sarlet et al, hereby incorporated by reference in its entirety, published in the Proceedings of the European Conference on Optical Communications (ECOC) 1999, pp. 128–129, in which the authors describe a method of characterizing an SSG-DBR laser, in which a two-dimensional scan of the front SSG and rear SSG is employed.

There therefore exists an urgent need for a method of characterization of TSLD's, which can be performed simply, speedily, and at low cost, to enable more cost-effective, widespread use of these devices.

The disclosures of each of the publications mentioned in this section and in other sections of the specification, are hereby incorporated by reference, each in its entirety.

SUMMARY OF THE INVENTION

The present invention seeks to provide a new method that substantially reduces the time for characterization of TSLD's as compared to that of prior art methods. In this method the laser is stimulated in a way that discloses the optical properties and tuning current dependency of the individual sections of the laser, separately for each section, and independently of the other sections. This reduces the problem from a multi-dimensional problem, to a set of separate one dimensional problems which can be solved serially. Once this has been performed, each section of the laser can be tuned separately to the desired wavelength, independently of the other sections.

The method, according to a preferred embodiment of the present invention, is operative to maintain fairly constant lasing power level during a change in one of the tuning currents, without the need to adjust the other currents. This enables the monitoring of the change in wavelength associated with the tuning of that particular section alone, without dependence on the other sections. Unlike the situation existing in the prior art methods, according to the various embodiments of the present invention, the output of the laser can be observed continuously during the characterization process, without the need for continuous adjustments of the various section currents.

The typical TSLD is constructed of a gain section, a phase section, and several wavelength selective sections. A spectral plot of the cavity gain versus wavelength shows the combined transmission of all of the sections in the laser. However in CW operation the preferably excited main lasing mode suppresses any other gain peaks, causing them to have much lower power levels.

This thus provided, in accordance with a preferred embodiment of the present invention, a method wherein different sections of a TSLD are modulated, in order to excite a continuum of modes related to the spectral response of another particular section. The results of this process can be observed by viewing the overall spectral response at an integration time significantly longer than the modulation time. The spectral positions of the modes and their dependence on the DC tuning current applied to another non-modulated section, are used to determine the tuning characteristic of that particular other section.

It should be emphasized that although modulation is generally performed by means of injection currents, the methods of the present invention also operate where voltage modulation is used, and the term modulation, as used and claimed in this application, is understood to cover either form.

It is known that during turn-on time, or when the laser is modulated, i.e. the gain section is modulated, preferably by current modulation, the laser exhibits multimode operation. This is because of the time required for the main lasing mode to build up and dominate over the other modes. When the laser is modulated at a high enough rate, there is not enough time for this build-up to be completed. In this case the gain section acts as a quasi white light source, in accordance with the discrete Fabry Perot modes present, making it possible for a number of modes to arise without the need for phase adjustment using the phase current. These modes will be at wavelengths of high net gain in the laser cavity.

According to another preferred embodiment of the present invention, the application of modulation to the gain section makes it possible to view the spectral response of the laser, including the combined spectral structure of all the sections over a wide range. A change in the tuning current to one section shifts the total spectral response of the laser and also consequently the radiating modes, thus making it possible to determine the tuning characteristic of that section.

According to another preferred embodiment of the present invention, instead of modulating the gain in order to stimulate multi-mode operation, modulation can be applied to the phase section. As the phase current changes, the Fabry Perot modes shift in wavelength and effectively scan the spectrum, providing an opportunity for different wavelengths to radiate, provided the modes associated with those wavelengths have enough gain in the cavity. These wavelengths do not radiate simultaneously, as opposed to the previously described embodiment of the invention, where the gain section is modulated. However, by viewing the complete spectral output of the laser, integrated over a time significantly longer than the modulation period, it is possible to obtain a complete plot of the gain versus wavelength. Thus, by changing the tuning current to one of the sections, it is possible to monitor the change in the spectral response of the laser, and to obtain the tuning characterization of that section, independently of the other sections.

When the laser is stimulated to operate at many wavelengths, according to either of the above-preferred embodiments using gain modulation or modulation of the phase section, the gain in the cavity depends on the product of the transmission of all the wavelength selective sections in the laser. According to another preferred method of the present invention, in order to isolate the response of one section only, an additional modulation signal is applied to other sections, thus effectively canceling the spectral effect of the modulated sections on the laser output. The response of those sections is spread over the complete spectrum of the laser output. The total time-integrated response of those sections is thus uniform. The only element of the laser that maintains a wavelength selective function is that of the section that is not modulated. Consequently, that section alone will essentially determine the wavelengths and relative powers that the laser emits. Changing the tuning current to that section enables the monitoring of the change in the spectral response of the laser, and thus the determination of the tuning characterization of that section.

The spectral data obtained may be utilized, according to other preferred embodiments of the present invention, to provide information about the optical attributes of the various sections of the laser. One such characteristic is the reflectance spectrum of the reflector section, as given by the wavelengths of peak reflection of a sampled Bragg reflector section, or of a superstructure grating Bragg reflector, or the spacing between reflector peaks. Other such characteristics could be the transmittance spectrum of a coupler section, as given by the wavelengths of peak transmittance of the coupler section or by the passband width in the output spectrum. Such information is useful in examining the processes involved in laser manufacture, and for determining the effects of laser structure on its output spectrum.

In accordance with yet another preferred embodiment of the present invention, there is provided a method of determining an optical characteristic of a first section of a tunable semiconductor laser diode having a plurality of sections, by modulating at least one second section of the laser.

In accordance with yet more preferred embodiments of the present invention, the first section may be a sampled Bragg reflector, or a superstructure sampled Bragg reflector, and the optical characteristic may respectively be a wavelength or several wavelengths of peak reflections of the sampled Bragg reflector, or a superstructure sampled Bragg reflector.

In accordance with another preferred embodiment of the present invention, the first section may be a coupler section and the optical characteristic may be a wavelength of the peak transmittance of the coupler section, or the passband width of the coupler section. Alternatively and preferably, if the first section is a reflector section, the optical characteristic may be the free spectral range between reflector peaks.

In accordance with yet more preferred embodiments of the present invention, the optical characteristic may be a tuning characteristic of the first section of the laser, and that tuning characteristic may be used to characterize the laser.

In accordance with still more preferred embodiments of the present invention, the above-mentioned at least one second section of the laser may be a gain section, a phase section, or both.

There is further provided in accordance with yet another preferred embodiment of the present invention, a method of characterizing a tunable semiconductor laser diode, having at least a first section and at least a second section, consisting of the steps of modulating at least the first section of the laser, varying the tuning current to the second section of the laser, and observing the change in spectral output of the laser as a function of the current.

Furthermore, in accordance with yet other preferred embodiments of the present invention, the above-mentioned at least a first section may be a gain section, a phase section, or both.

Furthermore, in accordance with yet more preferred embodiments of the present invention, the second section may be a coupler section or a reflector section, and the laser may be a GCSR laser or an SSG-DBR laser or an SG-DBR laser or an DBR laser.

There is also provided in accordance with a further preferred embodiment of the present invention a method of characterizing a tunable semiconductor laser diode having a plurality of sections, wherein the characterization of each section is performed independently of the other sections.

In accordance with yet more preferred embodiments of the present invention, the laser may be a GCSR laser, or an SSG-DBR laser or an SG-DBR laser or an DBR laser.

There is further provided in accordance with yet another preferred embodiment of the present invention a method of characterizing a tunable semiconductor laser diode having a plurality of sections, wherein the characterization of each section is performed separately.

According to more preferred embodiments of the present invention, the laser may be a GCSR laser, or an SSG-DBR laser or an SG-DBR laser or an DBR laser.

In accordance with still another preferred embodiment of the present invention, there is provided a method of characterizing a first wavelength selective section of a tunable semiconductor laser diode, having a gain section and at least one additional wavelength selective section, consisting of the steps of (a) injecting into the first wavelength selective section a first tuning current,
(b) Modulating the gain section at a rate sufficiently high to produce multimode operation,
(c) Modulating the above-mentioned at least one additional wavelength selective sections at a rate significantly slower than the modulation rate of the gain section,
(d) Measuring the property of at least one feature in the spectral response of the laser,
(e) Injecting a second tuning current and repeating steps (b) to (d) at least once, and
(f) Using the relationship between the measured properties and the first and second tuning currents to construct a characterization curve for the first wavelength selective section.

According to a further preferred embodiment of the present invention, the above-mentioned property may be the wavelength of the at least one feature of the spectral response of the laser.

In accordance with further preferred embodiments of the present invention, the feature mentioned in (d) hereinabove may be either a peak, or a minimum, or a spectral shape in the spectral response of the laser or the free spectral range between reflector peaks.

There is provided in accordance with yet a further preferred embodiment of the present invention, a method of characterizing a tunable semiconductor laser diode having wavelength selective sections and a gain section, consisting of the steps of:

(a) injecting into a first wavelength selective section a first tuning current,
(b) modulating the gain section at a rate sufficiently high to produce multimode operation,
(c) modulating at least one additional wavelength selective section at a rate significantly slower than the modulation rate of the gain section,
(d) measuring a property of at least one feature of the spectral response of the laser,
(e) injecting a second tuning current and repeating steps (b) to (d) at least once,
(f) using the relationship between the measured properties of the feature and the first and second tuning currents to construct a characterization curve for the first wavelength selective section,
(g) repeating steps (a) to (f) for each additional wavelength selective section of the laser.

According to a further preferred embodiment of the present invention, the above-mentioned property may be the wavelength of the at least one feature of the spectral response of the laser.

Furthermore, in accordance with yet another preferred embodiment of the present invention, the feature mentioned in paragraph (d) above may be a peak in the spectral response of the laser, or a minimum in the spectral response of the laser, or the measured passband of the laser, or the free spectral range between reflector peaks.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
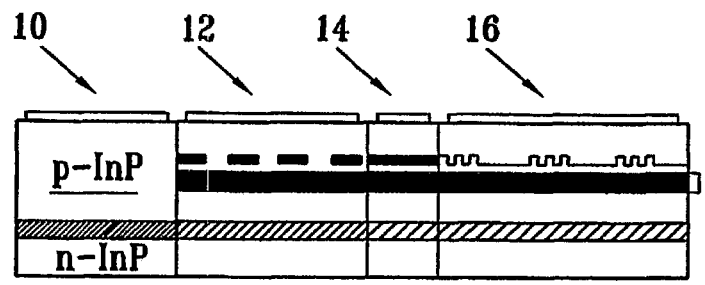
FIG. 1 is a schematic illustration of a TSLD, showing the constituent sections operative in determining the lasing wavelength of the device.

Reference is now made to FIG. 1, which illustrates schematically the structure of a commonly used TSLD, showing the constituent sections operative in determining the lasing wavelength of the device. The TSLD shown is known as a Grating Coupler Sampling Reflector laser, or a GCSR laser. The GCSR laser is used in this specification to illustrate the methods of the various preferred embodiments of the present invention, though it is to be understood that the methods described are applicable and operable also with other TSLD's.

The GCSR laser has four sections, a Gain section 10, a Sampled Reflector 16, a Coupler 12, and the Phase section 14. These sections function in the following manner:

In the gain section 10, the generation and amplification of photons takes place. The current to this section is the pump current for the laser, and affects the tuning mechanism in a similar manner to the phase section.

Figure 2:
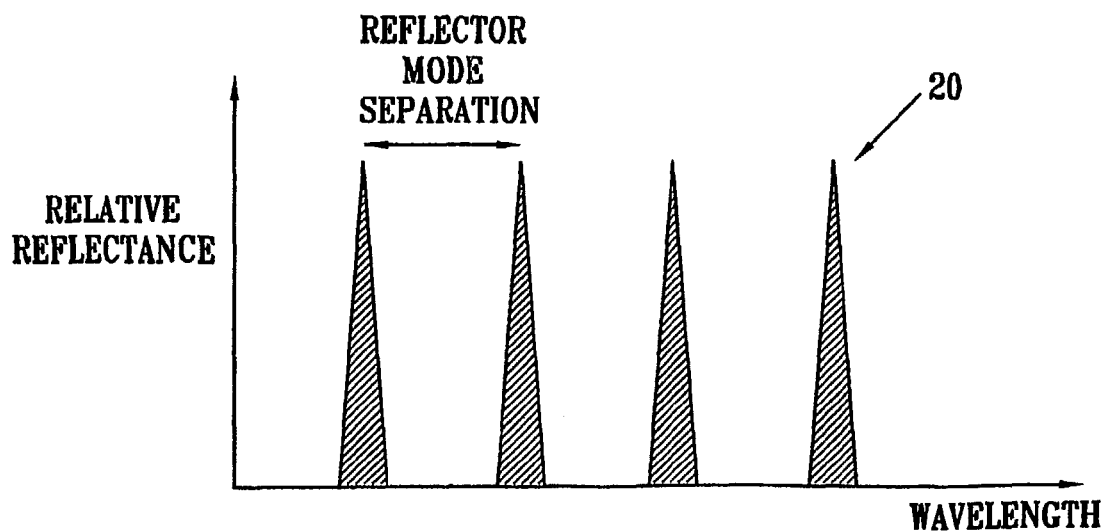
FIG. 2 is a schematic graph of the relative reflectance of the Bragg grating section of the laser shown in FIG. 1, as a function of wavelength.

A Sampled Reflector 16, is placed at one end of the resonator, instead of the mirror used in a conventional laser cavity. Unlike a mirror, the SR which is a sampled Bragg grating, reflects a comb of wavelengths back into the resonator, as is depicted in FIG. 2. The spacing of the comb 20 in the example shown is typically 4 nm for a laser operating in the wavelength range around 1500 nm. The width of one tooth of the comb is a fraction of this. The total wavelength span of the reflector is about 100 nm.

Figure 3:
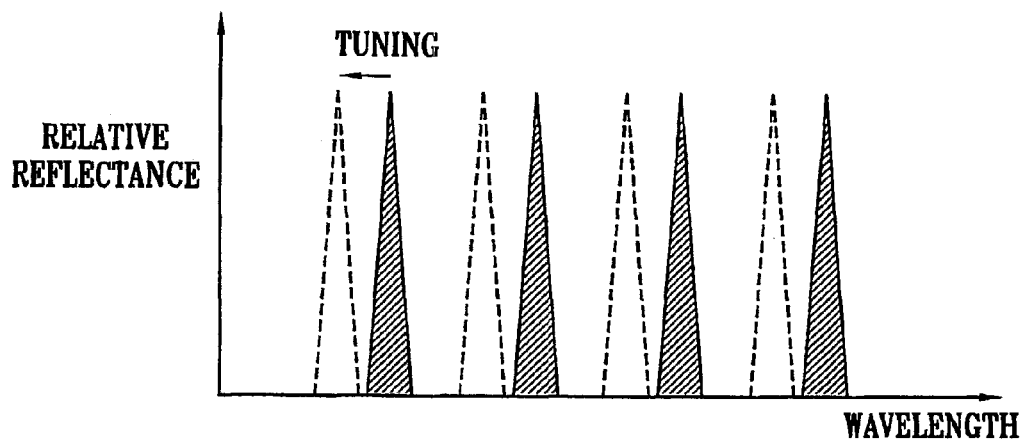
FIG. 3 is a schematic illustration of how the reflection peaks of the grating response shown in FIG. 2 shift in wavelength with change in tuning current.

When a tuning current is applied to the reflector, all of the reflector modes change their wavelength in accordance to the size of the current change; higher tuning currents shift the reflector peaks to shorter wavelengths by an amount essentially proportional to the current, as shown in FIG. 3, and lower tuning currents shift the reflector peaks to longer wavelengths.

Figure 4:
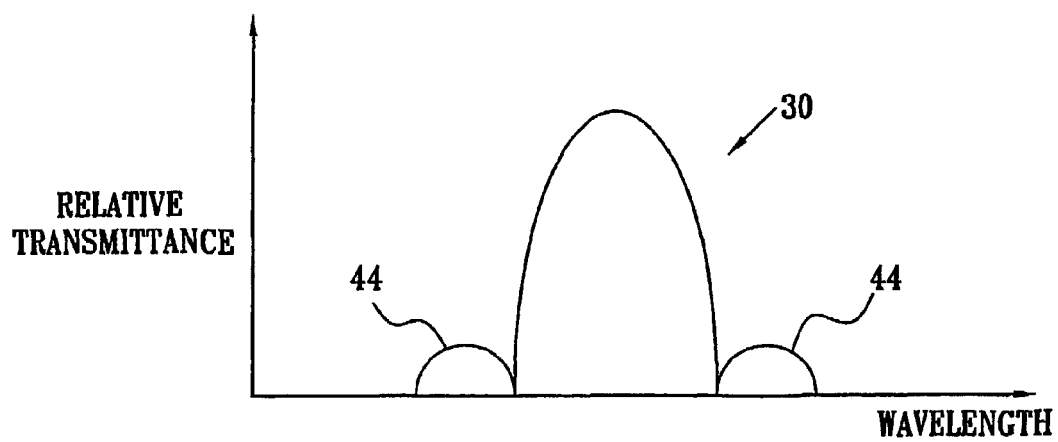
FIG. 4 is a schematic plot of the relative transmittance of the coupler section of the laser shown in FIG. 1.

Returning to the structure of the GCSR laser shown in FIG. 1, the third section, the coupler section 12, acts as a band pass optical filter inside the laser. The bandwidth of the coupler is typically about 10 nm. This section is used to filter out one of the reflector modes. FIG. 4 shows the spectral response of the coupler. The dominant coupler mode 30, monopolizes almost all of the cavity gain, such that the side modes 44 are effectively suppressed and hence very small.

Figure 5:
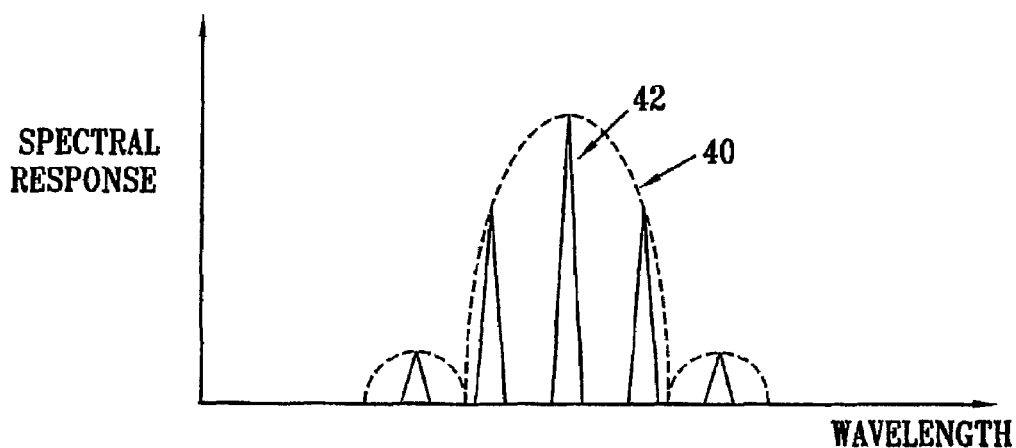
FIG. 5 is a schematic plot of the combined spectral response of the reflector and coupler sections of the laser shown in FIG. 1, which determines the overall cavity gain spectrum.

The coupler too can be current tuned to fit its peak response to a specific wavelength. The combined spectral response of the reflector and the coupler is the product of the individual spectral responses, as shown in FIG. 5. As is observed, the intensity of the individual reflector peaks 42, are modulated by the coupler mode envelope 40.

Figure 6:
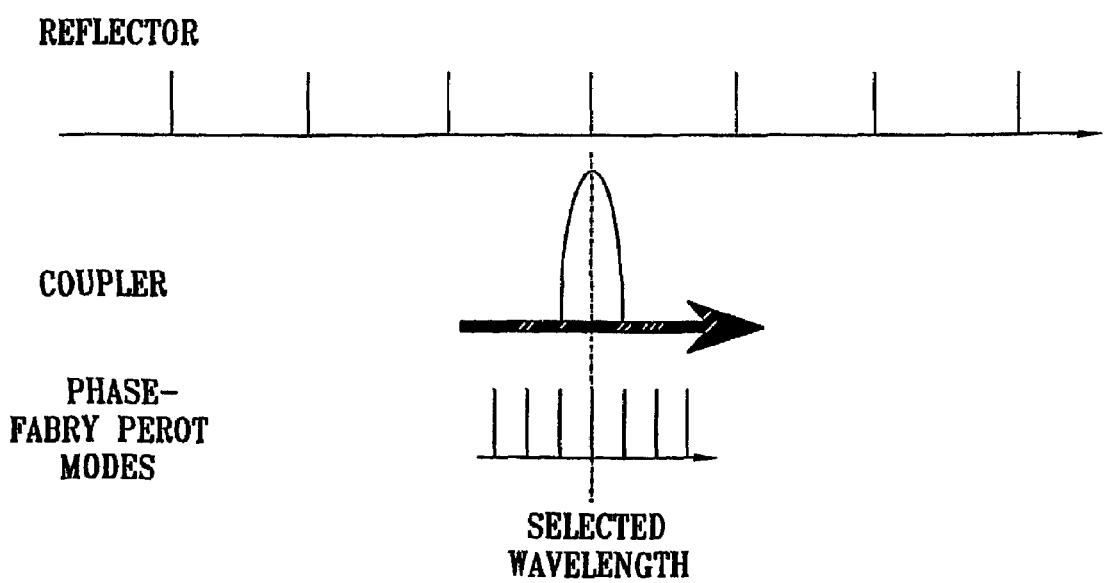
FIG. 6 is a schematic representation of the wavelength alignment needed between the various sections of the laser shown in FIG. 1, in order to correctly tune the laser to a required wavelength.

Reference is now made to FIG. 6 which shows the wavelengths of the reflector, the coupler and a Fabry-Perot mode of the laser shown in FIG. 1, all lined up at the desired lasing wavelength.

Tuning the GCSR laser to a specific wavelength is performed by providing the maximum gain at that specific wavelength and maximum attenuation at other wavelengths.

The spectral response of the SR and GC can be shifted on the wavelength axis simply by injecting current into those of the laser. Currents are injected to the SR and GC to align their response to the required wavelength.

Since the required wavelength is arbitrary with respect to the laser structure, it is not likely that it will satisfy the phase condition i.e. coincide with a Fabry Perot mode. In order to ensure that this is fulfilled, the phase section is used. This section is a simple waveguide. Its optical length is adjusted electrically in order to satisfy the phase condition of a required wavelength. The adjustment is made by injecting current into this section. If the phase is not adjusted correctly, and the Fabry Perot mode is not exactly at the same wavelength as that to which the coupler and reflector are adjusted, then the laser may radiate at the Fabry Perot mode closest to that wavelength, but with reduced efficiency.

Figure 7:
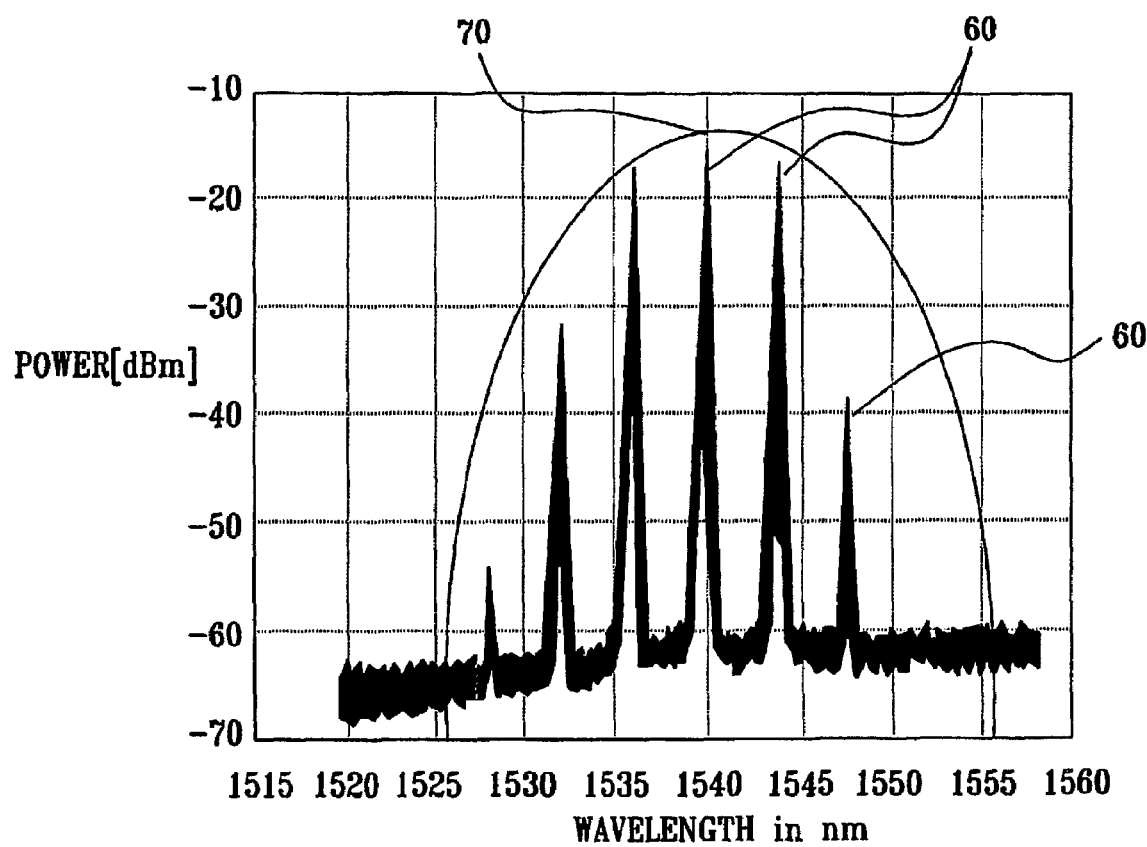
FIG. 7 is a spectral response plot obtained from a gain-modulated GCSR laser, according to a preferred embodiment of the present invention.

Reference is now made to FIG. 7, which shows the spectral response plot obtained from a gain-modulated GCSR laser, according to a preferred embodiment of the method of the present invention. When a modulated signal is applied to the gain section 10 of the laser, the gain discrimination requirements for single mode operation are no longer met, and the gain section behaves as a wide bandwidth source, allowing a number of modes to propagate, as explained in the summary section hereinabove. The laser emits at a number of wavelengths 60 where the coupler response envelope 70 allows mode propagation. These wavelengths correspond to the combined spectral response of the reflector and coupler.

Figure 8:
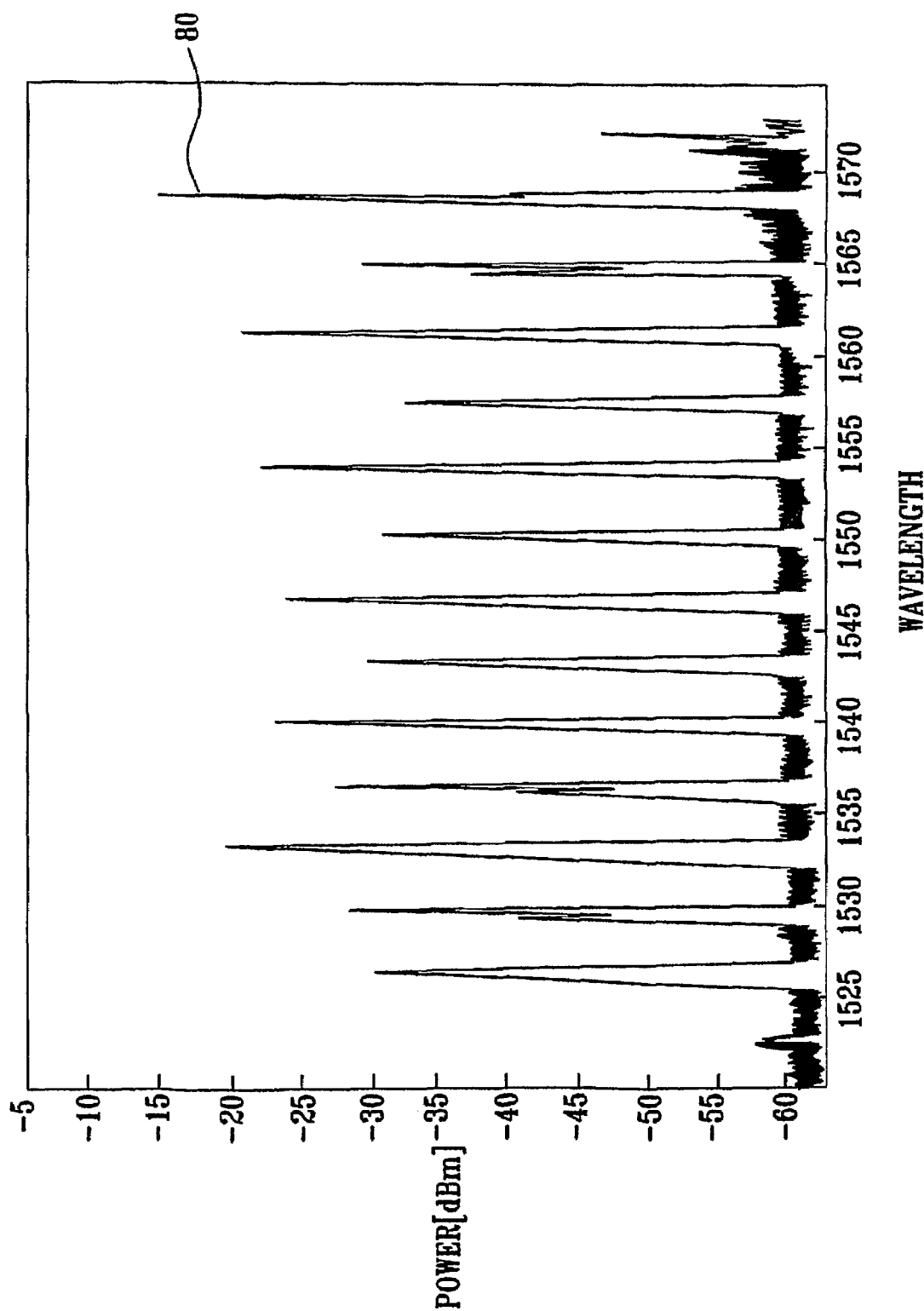
FIG. 8 is a spectral response plot obtained from a GCSR laser having both its gain section and its coupler section modulated, according to a preferred embodiment of the present invention.

By experimentally recording the wavelengths of the reflector peaks at different reflector currents, it is possible to obtain the tuning function of the reflector i.e. the function $\lambda(i_r)$ of each of the reflector modes. In order to view all of the reflector modes simultaneously, an additional slow modulation signal is applied to the coupler to scan the whole range of the reflector. Reference is now made to FIG. 8, which is a spectral response plot obtained, using an optical spectral analyzer (OSA), from a GCSR laser having both its gain section 10 and its coupler section 12 modulated in this way, according to another preferred embodiment of the present invention. The gain section is modulated at a rate high enough to produce multimode operation, as described previously, and as a result, a large number of resonator modes, shown by their peaks 80 in FIG. 8, may propagate. The coupler section is modulated at a much slower rate, commensurate with the sweep rate of the OSA used to view and measure the positions of the mode peaks 80. The coupler modulation rate is preferably such as to "move" the coupler envelope several reflector peaks per microsecond, and hence, all of the reflection peaks 80 are seen as the OSA scans across the spectrum.

Though this preferred embodiment uses reflection peaks in the spectrum to define positions of the wavelengths of maximum reflection, and thus to characterize the tuning characteristics of the reflector, it should be understood by anyone of skill in the art that the characteristic can be determined by following the change in wavelength of any feature of the spectrum of the laser as a function of current applied to that section. Examples of such features could include not only local maxima, as shown in FIG. 8, but also local minima.

Figure 9:
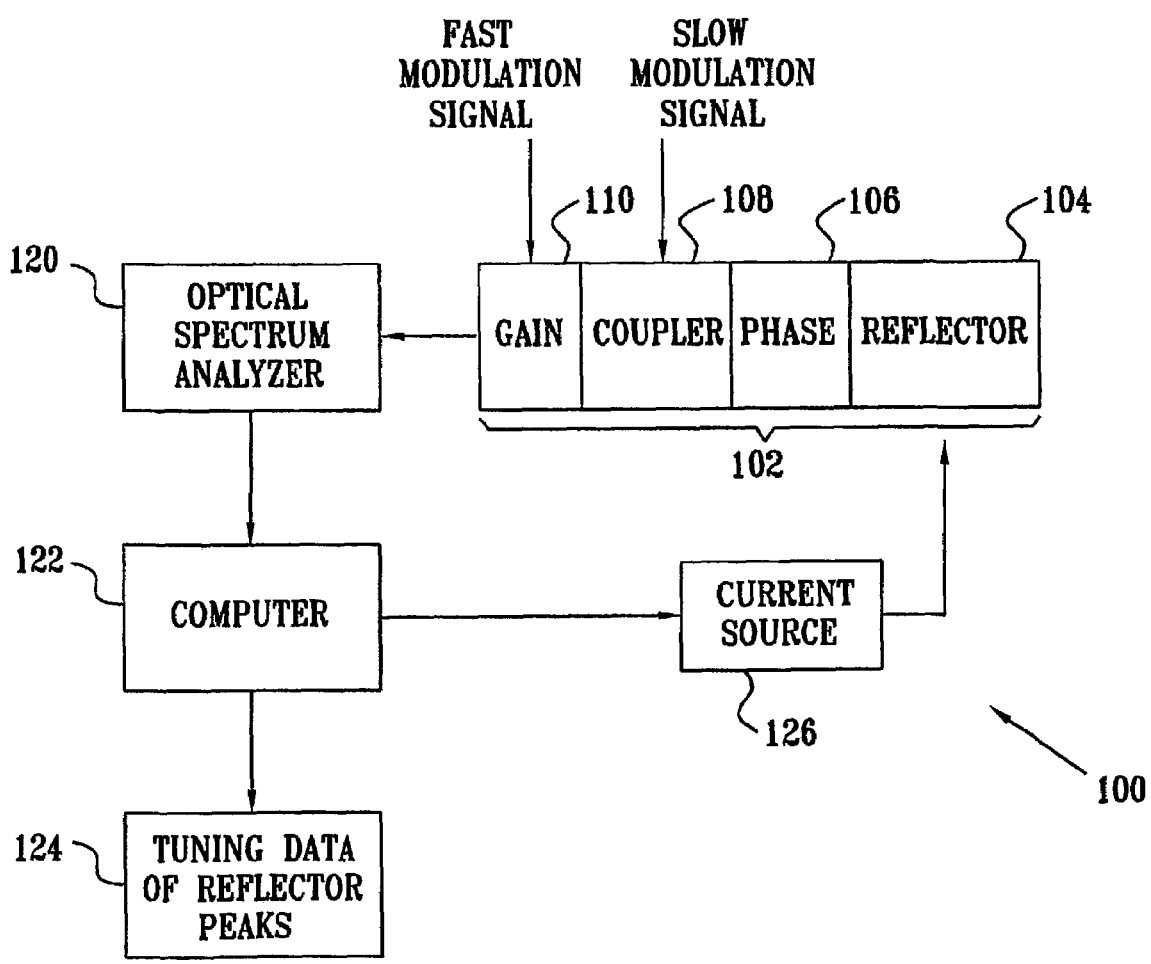
FIG. 9 is a schematic block diagram of an apparatus for experimentally performing a full reflector characterization scan, according to another preferred embodiment of the present invention.

Reference is now made to FIG. 9, which is a block diagram of a preferred apparatus 100 for performing such a scan. The apparatus 100 is used to perform measurements, according to a further preferred embodiment of the present invention, by which the reflector section of a GCSR laser is fully characterized. The gain section 110 is modulated at a high rate, preferably at more than approximately 20 MHz, and the coupler section 108 at a slower rate, preferably at more than approximately 1 MHz. It is to be understood though that the actual modulation rates used could be significantly different from these values, according to the apparatus used and the laser type to be characterized. A current source 126, controlled by a computing system 122, supplies the reflector 104 with a constant current at a predetermined level. Viewing the output of the laser with an optical spectrum analyzer 120, results in a reflector scan of the type shown in FIG. 8.

According to this preferred method of the present invention, for a given reflector current, the positions of the peaks of the reflector are noted. The reflector current is then slightly changed to a different level, and a new set of reflector peaks is noted, slightly shifted from the original set. For any selected peak, the relationship between the reflector peak wavelength and the reflector current is thus known. To a first approximation, this curve is close to linear, and hence the current required for any intermediate wavelength may be extracted by interpolation or extrapolation from a curve obtained from just two measurements. For a more accurate fit, any non-linearity of the curve can be taken into account by repeating the process at several currents, in order to obtain a more accurate representation of the curve. The individual peaks of the reflector scan are input to the computing system 122. According to a preferred method of utilizing this data, for each incremental wavelength desired, a look-up table 124 is calculated of the required current for the reflector section of the laser as a function of the desired wavelength.

Using this preferred method, it is also possible to characterize each of the other wavelength selective sections of the laser with relatively few measurements. If the highest level of accuracy is not required, even as few as two measurements suffices, as described above. In practice, final fine-tuning of the phase section (which is not a wavelength selective section) is also required, since the currents in the other sections affect the effective overall optical length of the cavity.

Finding the tuning function of the coupler may also be performed using modulation of the gain section, as can be seen from FIG. 7. The peaks of the laser modes outline the shape of the coupler envelope, and thus the peak wavelength of the coupler response can be estimated for a given coupler current by experimentally choosing the best fit of the shape of the envelope of the peaks as the coupler response curve, and determining where its estimated maximum lies. Repeating this procedure with different coupler currents gives the tuning function of the coupler. With the tuning functions of the reflector and coupler known, tuning the laser to a given wavelength is very simple, and only fine tuning of the phase current is needed to achieve maximum power at the desired wavelength.

Figure 10A:
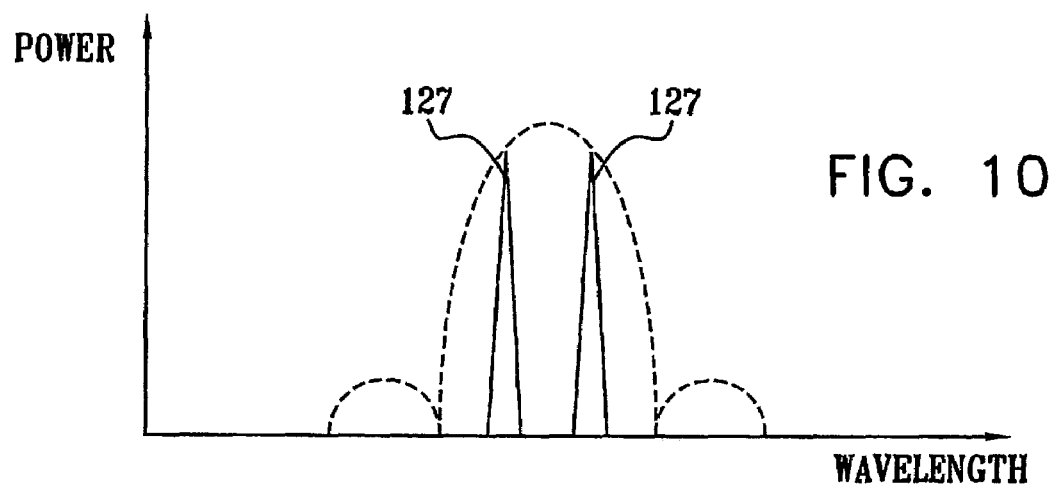
FIGS. 10A and 10B are plots of the output of a laser as a function of wavelength, while the reflector is being modulated at a small amplitude.
Figure 10B:
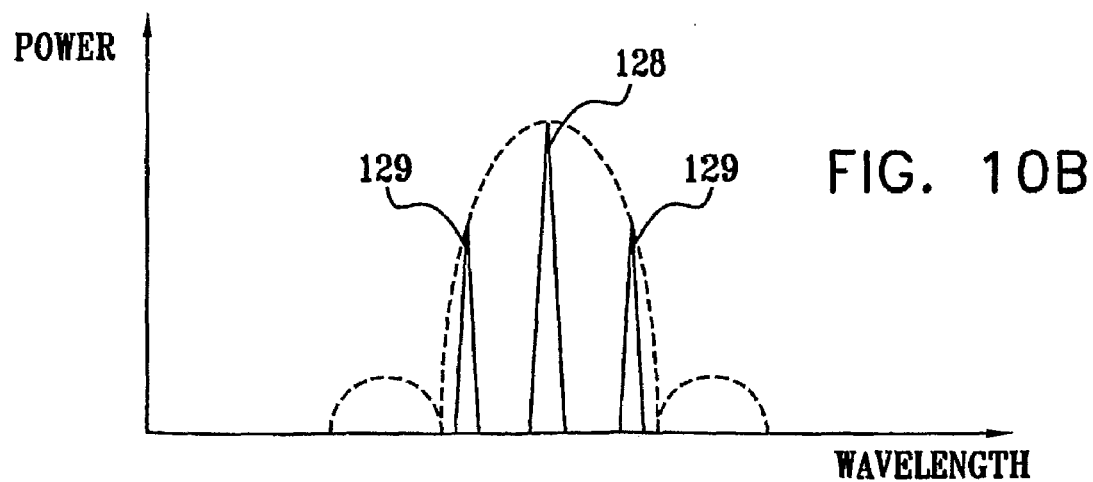

Reference is now made to FIG. 10A, which is used to illustrate yet a further preferred method according to another embodiment of the present invention. FIG. 10A is a plot of the output of a laser as a function of wavelength, while the reflector is being modulated at a small amplitude. Because of the small amplitude of modulation, only a few reflector modes 127 are generally visible, two in the case of FIG. 10A. The bias of the modulation current to the reflector section is adjusted in order to provide a symmetrical alignment of the visible reflector modes near the center of the OSA display. There are two possibilities of interest in this alignment procedure:

1. When there are two modes equal in power, as shown by modes 127 in FIG. 10A, the coupler peak is assumed to be half way between them.
2. When there is one central mode 128 and two equal modes 129 on either side, the coupler peak is assumed to coincide with the location of that central mode 128. This possibility is shown in FIG. 10B.

By this method, the location of the coupler peak is easily determined. By repeating for several coupler currents, the complete tuning graph of the coupler is obtained.

In order to tune the laser to any given wavelength, it is sufficient to look up the current required at that wavelength for each section, preferably using the tuning curve of each particular section, or a look-up table for the sections, or any other suitable method of storing the current versus wavelength data for each section, and to tune each section sequentially with the required current. By this means, the complete characterization process can preferably be achieved in a fraction of the time required by the above described prior art methods.

Figure 11:
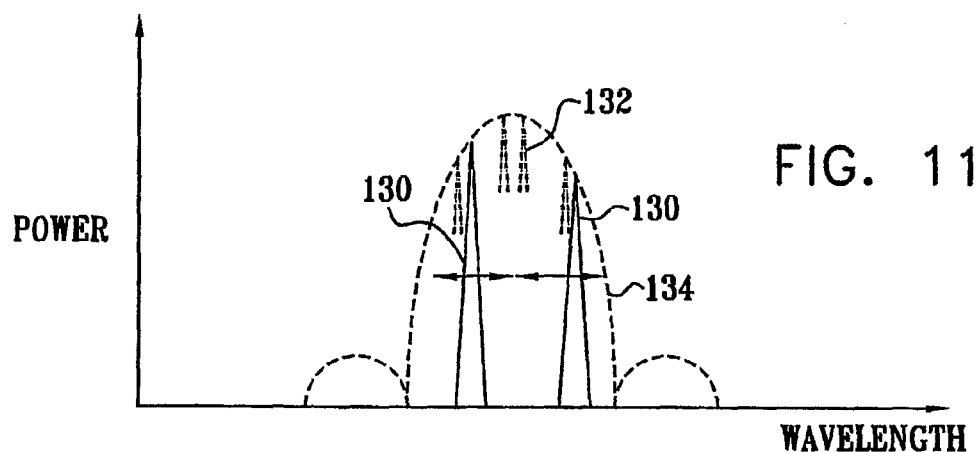
FIG. 11 is schematic wavelength plot of the lasing output of a GCSR laser with the gain and reflector sections modulated simultaneously, according to another preferred embodiment of the present invention.

Reference is now made to FIG. 11, which is a schematic wavelength plot of the lasing output of a GCSR laser with the gain and reflector sections modulated simultaneously, according to another preferred embodiment of the present invention. Because of the additional modulation of the reflector, the originally viewed reflector peaks 130 move to cover the spectrum. The spread of these peaks is indicated by the additionally visible peaks 132. The limitation imposed by the coupler response causes the laser output spectrum to take the envelope shape of the coupler transmittance, and to fill the complete envelope 134.

Figure 12:
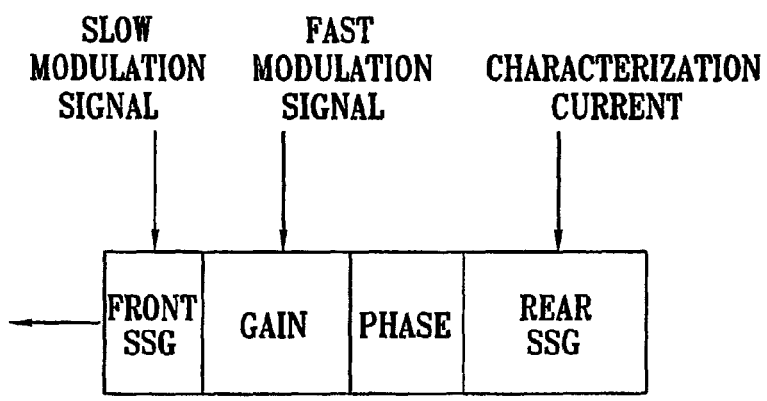
FIG. 12 is a schematic rendering of an SSG-DBR laser, as is known in the art, showing the application of modulation signals for performing a characterization method according to a further preferred embodiment of the present invention.
Figure 13:
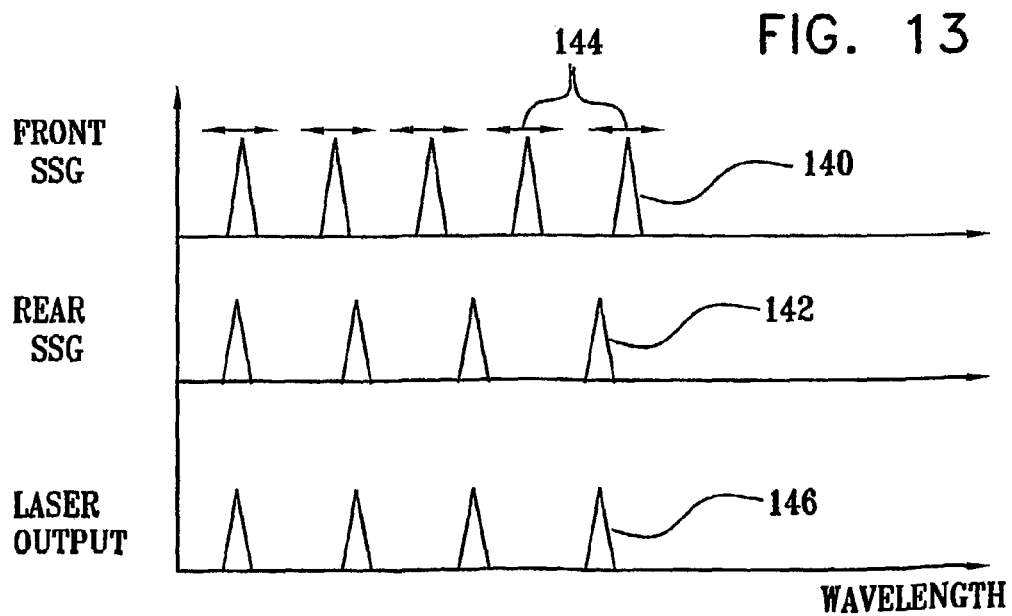
FIG. 13 is a schematic wavelength plot showing the manner in which an SSG-DBR laser of the type shown in FIG. 12 is characterized, using modulation to the gain section and one of the SSG reflector sections of the laser, according to another preferred embodiment of the present invention.

Reference is now made to FIGS. 12 and 13, which are schematic drawings showing a method by which an SSG-DBR laser is characterized using modulation to the gain and one of the reflector sections of the laser, according to another preferred embodiment of the present invention.

FIG. 12 is a schematic rendering of an SSG-DBR laser, as is known in the art, as is known in the art, showing the application of modulation signals for performing a characterization method according to a further preferred embodiment of the present invention. The laser has 4 sections: gain, phase, and two SSG reflectors.

FIG. 13 shows a schematic wavelength plot of the SSG reflector peaks and tile wavelength outputs of a laser of the type shown in FIG. 12. The front SSG reflector peaks 140, and the rear SSG reflector peaks 142 have a slightly different period. According to this preferred method of the present invention, the gain section is modulated at a high frequency, and one of the SSG sections at a lower frequency, in a similar way to that mentioned hereinabove in connection with the method described in connection with FIGS. 8 and 9. When modulating the gain section and one of the SSG reflectors, 144, the front one according to the preferred embodiment shown in FIG. 12, the laser emits at wavelengths 146 corresponding to peaks 142 of the unmodulated reflector. By varying the current to the unmodulated reflector, its tuning characteristics can be measured in a manner similar to the method described hereinabove in connection with FIGS. 8 and 9.

It is appreciated by persons skilled in the art that the present invention is not limited by what has been particularly shown and described hereinabove. Rather the scope of the present invention includes both combinations and sub-combinations of various features described hereinabove as well as variations and modifications thereto which would occur to a person of skill in the art upon reading the above description and which are not in the prior art.

We claim:

1. A method of characterizing a first wavelength selective section of a tunable semiconductor laser diode, having a gain section and at least one additional wavelength selective section, comprising the steps of:
   (a) injecting into said first wavelength section a first tuning current;
   (b) modulating said gain section at a rate sufficiently high to produce multimode operation;
   (c) modulating said at least one additional wavelength selective sections at a rate significantly slower than said modulation rate of said gain section;
   (d) measuring a property of at least one feature in the spectral response of said laser;
   (e) injecting a second tuning current and repeating steps (b) to (d) at least once; and
   (f) using the relationship between said measured properties and said first and second tuning currents to construct a characterization curve for said first wavelength selective section.

2. The method according to claim 1, wherein said property is the wavelength of said at least one feature in said spectral response of said laser.

3. A method according to claim 1 wherein said feature is a peak in the spectral response of said laser.

4. A method according to claim 1 wherein said feature is a minimum in the spectral response of said laser.

5. A method of characterizing a tunable semiconductor laser diode having wavelength selective sections and a gain section, comprising the steps of:
   (a) injecting into a first wavelength selective section a first tuning current;
   (b) modulating said gain section at a rate sufficiently high to produce multimode operation;
   (c) modulating at least one additional wavelength selective section at a rate significantly slower than said modulation rate of said gain section;
   (d) measuring a property of at least one feature in the spectral response of said laser;
   (e) injecting a second tuning current and repeating steps (b) to (d) at least once;
   (f) using the relationship between said measured properties and said first and second tuning currents to construct a characterization curve for said first wavelength selective section;
   (g) repeating steps (a) to (f) for each additional wavelength selective section of said laser.

6. The method according to claim 5, wherein said property is the wavelength of said at least one feature in said spectral response of said laser.

7. A method according to claim 5 wherein said feature is a peak in the spectral response of said laser.

8. A method according to claim 5 wherein said feature is a minimum in the spectral response of said laser.

* * * * *